(12) United States Patent
Umezawa et al.

(10) Patent No.: US 8,276,108 B2
(45) Date of Patent: Sep. 25, 2012

(54) CIRCUIT DESIGN APPARATUS AND CIRCUIT DESIGN METHOD

(75) Inventors: Yasushi Umezawa, Kawasaki (JP); Takeshi Shimizu, Kawasaki, PA (US)

(73) Assignee: Fujitsu Limited, Kawasaki (JP)

( * ) Notice: Subject to any disclaimer, the term of this patent is extended or adjusted under 35 U.S.C. 154(b) by 54 days.

(21) Appl. No.: 12/491,030

(22) Filed: Jun. 24, 2009

(65) Prior Publication Data

US 2010/0005433 A1      Jan. 7, 2010

(30) Foreign Application Priority Data

Jul. 1, 2008    (JP) .................................. 2008-172188

(51) Int. Cl.
  *G06F 9/455* (2006.01)
(52) U.S. Cl. ........ 716/106; 716/101; 716/104; 716/107; 716/111
(58) Field of Classification Search .................. 716/106, 716/111, 51, 104
See application file for complete search history.

(56) References Cited

U.S. PATENT DOCUMENTS

| | | | | |
|---|---|---|---|---|
| 5,519,630 | A * | 5/1996 | Nishiyama et al. ........... | 716/102 |
| 6,618,841 | B1 * | 9/2003 | Huang ........................... | 716/103 |
| 6,820,047 | B1 | 11/2004 | Aizawa et al. | |
| 7,313,683 | B2 * | 12/2007 | Takahashi ..................... | 713/2 |
| 2004/0205430 | A1 * | 10/2004 | Kimura et al. ................ | 714/724 |
| 2007/0121359 | A1 * | 5/2007 | Kanda ........................... | 365/51 |
| 2008/0215955 | A1 * | 9/2008 | Kimbara et al. .............. | 714/768 |
| 2009/0144598 | A1 * | 6/2009 | Yoon et al. .................... | 714/752 |

FOREIGN PATENT DOCUMENTS

| | | |
|---|---|---|
| JP | 63-073437 | 4/1988 |
| JP | A 2-90334 | 3/1990 |
| JP | 2001-134629 | 5/2001 |
| JP | A 2004-21922 | 1/2004 |
| JP | 2007-226818 | 9/2007 |
| JP | 2009-009270 | 1/2009 |

OTHER PUBLICATIONS

Notification of Reasons for Refusal mailed Mar. 27, 2012 from Japanese Patent Application No. 2008-172188 (with partial English translation).

* cited by examiner

*Primary Examiner* — Thuan Do
*Assistant Examiner* — Brian Ngo
(74) *Attorney, Agent, or Firm* — Greer, Burns & Crain, Ltd.

(57) ABSTRACT

A circuit design apparatus for designing an LSI including a memory circuit for storing data and an error protection circuit for performing an error protection over the data stored in the memory circuit on the basis of design information, the circuit design apparatus includes: an extracting unit for extracting information of configuration of the memory circuit with error protection circuit from the design information; and a circuit arrangement controller for determining whether to insert a check circuit for supplying a check signal into the memory circuit to verify the error protection circuit on the configuration information.

5 Claims, 10 Drawing Sheets

FIG. 12

PROPERTY FOR FORMAL CHECK  161

```
//CHECK ERROR DETECITNG LOGIC
vunit M_edetect(M){
    //ED: ODD PARITY
    property pCheck1 = always((EC & TO(^ED)) -> next HE);
    //FORMAL CHECK
    assert pCheck1;
}
```

CIRCUIT DESIGN APPARATUS AND CIRCUIT DESIGN METHOD

CROSS-REFERENCE TO RELATED APPLICATION

This application is based upon and claims the benefit of priority of the prior Japanese Patent Application No. 2008-172188, filed on Jul. 1, 2008, the entire contents of which are incorporated herein by reference.

FIELD

A certain aspect of the embodiments discussed herein is related to a technique of a circuit design.

BACKGROUND

It is well known that noise generated by radiation such as alpha rays or neutrons causes generation of an error in a memory circuit, e.g., a register or a memory cell in a hardware circuit.

Therefore, such a technology is well known that data is protected from an error by providing parity check or error-check-and-correct (ECC) or other methods to a memory circuit upon designing the hardware circuit.

It cannot be verified by simulation, whether or not these functions work fine. Consequently, the verification is required by actually generating an error.

Then, such a technology is well-known that a circuit (error generating circuit) for generating an error is arranged to a memory circuit that is protected from the error so as to perform logic verification.

In addition, such a technology is well known that an adapter is inserted between a memory control circuit and a memory unit, and a data error designated by the adapter is inserted and is written to the memory unit so as to inspect an error detecting/correcting function of a memory control circuit upon reading the data. Above technology is disclosed in Japanese Laid-open Patent Publication No. 2-90334 and Japanese Laid-open Patent Publication No. 2004-21922 or the like.

SUMMARY

According to an aspect of an embodiment, a circuit design apparatus for designing an LSI including a memory circuit for storing data and an error protection circuit for performing an error protection over the data stored in the memory circuit on the basis of design information, the circuit design apparatus includes: an extracting unit for extracting information of configuration of the memory circuit with error protection circuit from the design information; and a circuit arrangement controller for determining whether to insert a check circuit for supplying a check signal into the memory circuit to verify the error protection circuit on the configuration information.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF THE DRAWINGS

FIG. 12 is a diagram showing an example of the property for formal verification.

DESCRIPTION OF THE EMBODIMENTS

Hereinbelow, a specific description will be given of an embodiment with reference to the drawings.

First of all, the outline according to the embodiment will be described and the embodiment will be thereafter mentioned in more detail.

Figure 1:
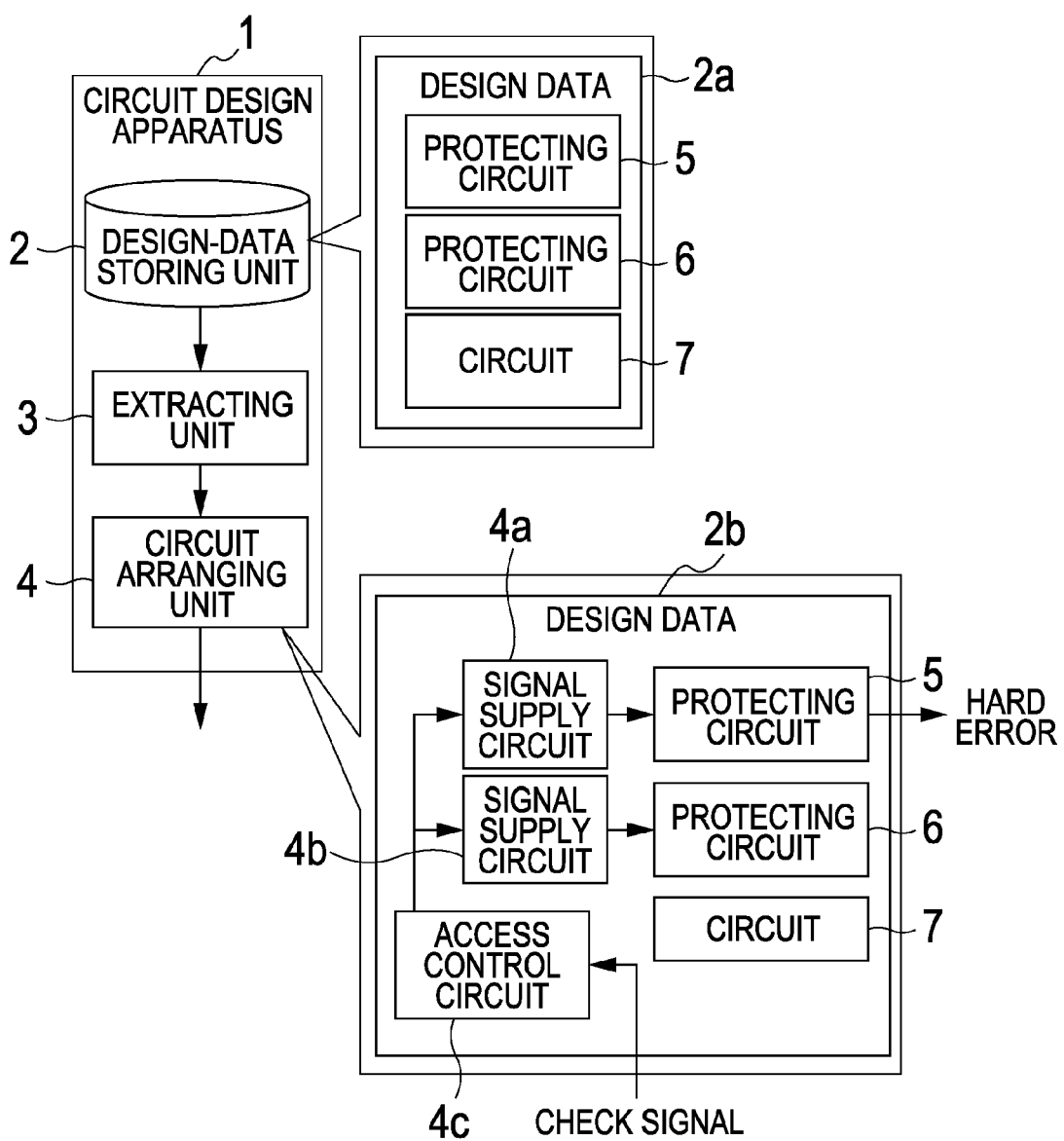
FIG. 1 is a diagram showing the outline according to the embodiment.

FIG. 1 is a diagram showing the outline according to the embodiment.

A circuit design apparatus 1 has a design data storing unit 2; an extracting unit 3; and a circuit arranging unit 4.

The design data storing unit 2 stores design data of a hardware circuit that is created in advance.

The extracting unit 3 extracts a memory circuit from the design data stored in the design data storing unit 2, the memory circuit having a function for checking an output error.

As an example, design data 2a shown in FIG. 1 has a protecting circuit 5 and a protecting circuit 6 having a function for checking an output error and that protect data therein from the output error, and a circuit 7 without the function for checking the output error. In this case, the extracting unit 3 extracts the protecting circuit 5 and the protecting circuit 6.

The circuit arranging unit 4 arranges a signal supply circuit that supplies a check signal to a memory circuit that is extracted by the extracting unit 3. The check signal is supplied for verifying an error check function in the memory circuit. The circuit arranging unit 4 also arranges an access control circuit that selectively supplies the check signal to the signal supply circuit.

As an example, in design data 2b shown in FIG. 1, a signal supply circuit 4a and a signal supply circuit 4b are arranged to the protecting circuit 5 and the protecting circuit 6, respectively, and an access control circuit 4c that selectively supplies a check signal to the signal supply circuit 4a and the signal supply circuit 4b is also arranged.

The circuit design apparatus 1 facilitates an arrangement of the signal supply circuit to the memory circuit without fails. Further, the circuit design apparatus 1 makes one access control circuit capable of controlling the plurality of signal supply circuits. Therefore, uniform management of the plurality of signal supply circuits becomes possible and the increase in circuit scale can be prevented.

Hereinbelow, an embodiment will be specifically described.

Figure 2:
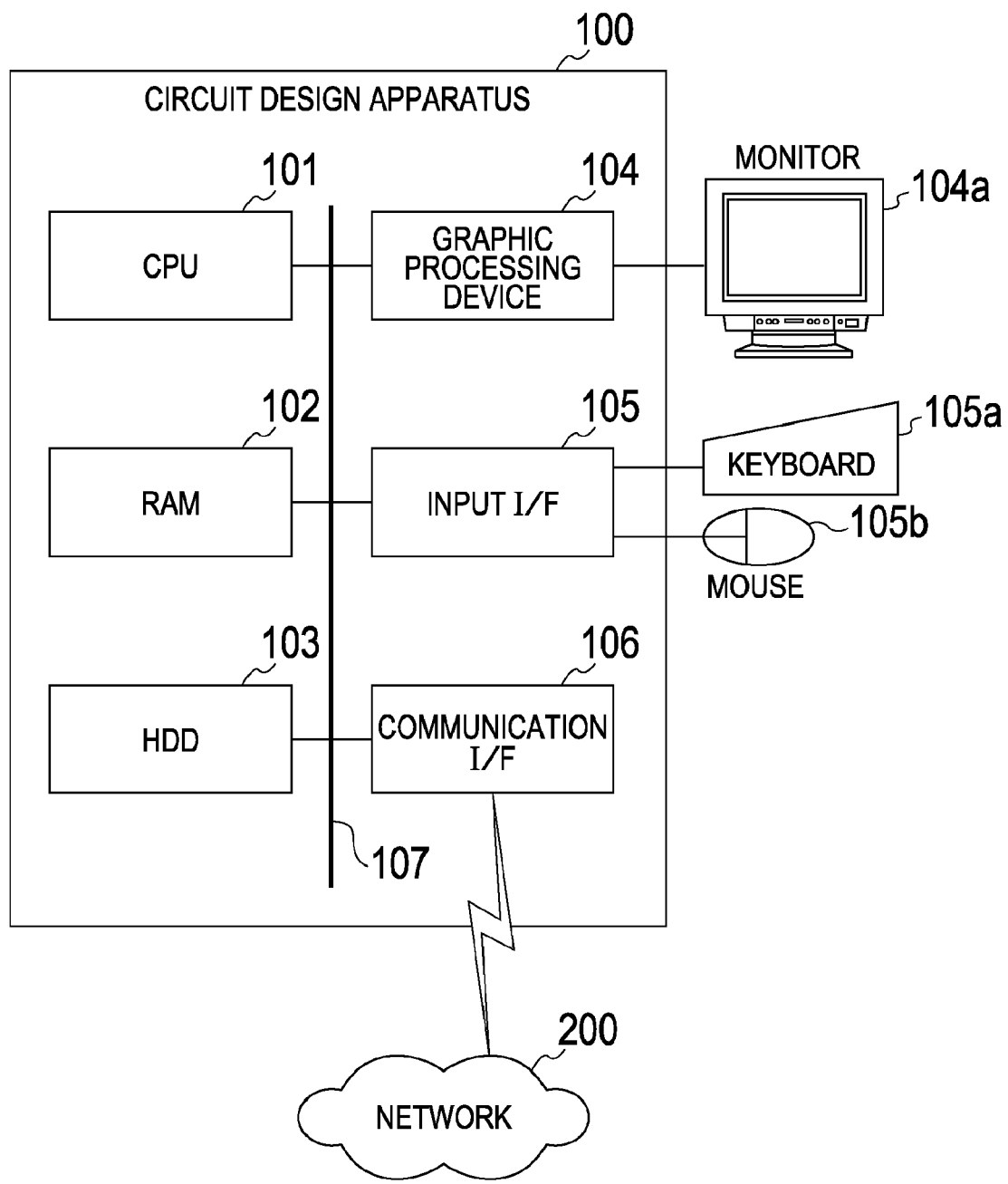
FIG. 2 is a diagram showing an example of a hardware structure of a circuit design apparatus.

FIG. 2 is a diagram showing a hardware structure example of a circuit design apparatus.

A circuit design apparatus 100 is entirely controlled by a CPU (Central Processing Unit) 101. A RAM (Random Access Memory) 102, a hard disk drive (Hard Disk Drive) 103, a graphic processing device 104, an input interface 105, and a communication interface 106 are connected to the CPU 101 via a bus 107.

The RAM 102 temporarily stores at least a part of a program of an OS (Operating System) and an application program, at least a part of a program of an OS (Operating System) and an application program being executed by the CPU 101. Further, the RAM 102 stores various data that need processing executed by the CPU 101. The HDD 103 stores the OS and the application program. Further, the HDD 103 stores a program file.

A monitor 104a is connected to the graphic processing device 104. The graphic processing device 104 allows an image to be displayed on a screen of the monitor 104a in accordance with an instruction from the CPU 101. A keyboard 105a and a mouse 105b are connected to the input interface 105. The input interface 105 transmits signals transmitted from the keyboard 105a and the mouse 105b to the CPU 101 via a bus 107.

The communication interface 106 is connected to a network 200. The communication interface 106 receives and transmits data from/to another computer via the network 200.

The above-mentioned hardware structure can realize a processing function according to the embodiment. In the system having the aforementioned hardware structure, the circuit design apparatus 100 has the following functions.

Figure 3:
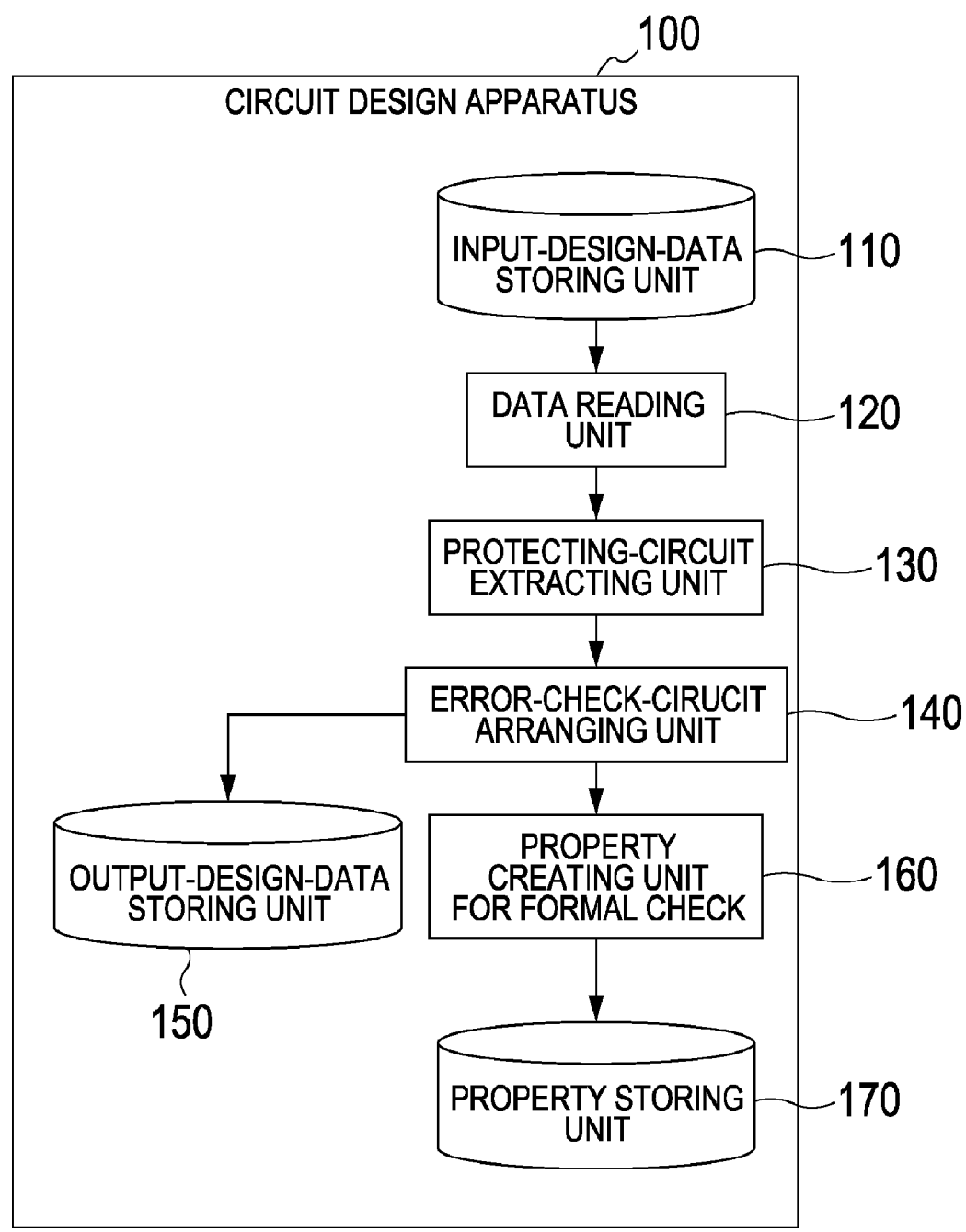
FIG. 3 is a block diagram showing a function of the circuit design apparatus.

FIG. 3 is a block diagram showing functions of the circuit design apparatus.

The circuit design apparatus 100 has: an input design data storing unit 110; a data reading unit 120; a protecting-circuit extracting unit 130; an error-check-circuit arranging unit 140; an output design data storing unit 150; a property creating unit 160 for formal verification; and a property storing unit 170.

The input design data storing unit 110 stores design data (e.g., RTL (Register Transfer Level)) of a module (hardware circuit) described by Verilog or VHDL (VHSIC Hardware Description Language) as a target for arranging a circuit necessary for error check.

The data reading unit 120 reads the design data stored in the input design data storing unit 110 in accordance with an operation of the keyboard 105a or the mouse 105b of a designer (user).

The protecting-circuit extracting unit 130 extracts a memory circuit (hereinafter, a "protecting circuit") that is protected from an error with a function for checking an error such as parity check or ECC function, protecting circuit being included in the design data read by the data reading unit 120.

For example, the protecting-circuit extracting unit 130 searches for the memory circuit protected from the error from among the design data read by the data reading unit 120. As this search method, there is a method for searching for the memory circuit by tracing back an error signal.

Upon searching for a register as the memory circuit, the protecting-circuit extracting unit 130 applies a naming rule prepared, and determines whether or not the searched register is a protecting circuit. The naming rule means that, e.g., "The register to which parity is applied is named "register name_p"". If "_p" is added to the searched register, this circuit is determined as the protecting circuit, and the register is then extracted by the protecting-circuit extracting unit 130.

Further, as another example in which it is determined whether or not the searched register is the protecting circuit, the protecting-circuit extracting unit 130 determines whether or not the searched register matches the register described in the list created by the designer. When the protecting-circuit extracting unit 130 determines the searched register matches the register described in the list r, this register is then extracted as the protecting circuit.

The error-check-circuit arranging unit 140 performs processing, which will be described below, of the protecting circuit extracted by the protecting-circuit extracting unit 130, and arranges a circuit (hereinafter, referred to as an "error check circuit") necessary for verifying an error check function in the protecting circuit.

The output design data storing unit 150 stores the design data to which the error check circuit is arranged.

The property creating unit 160 for formal verification creates a property for formal verification of the error check circuit.

Incidentally, the formal verification means a static check method for verifying the design and specification expressed by a mathematic model with a mathematical reasoning.

The property storing unit 170 stores the property created by the property creating unit 160 for formal verification.

Next, a description will be given of an operation of the circuit design apparatus 100.

Figure 4:
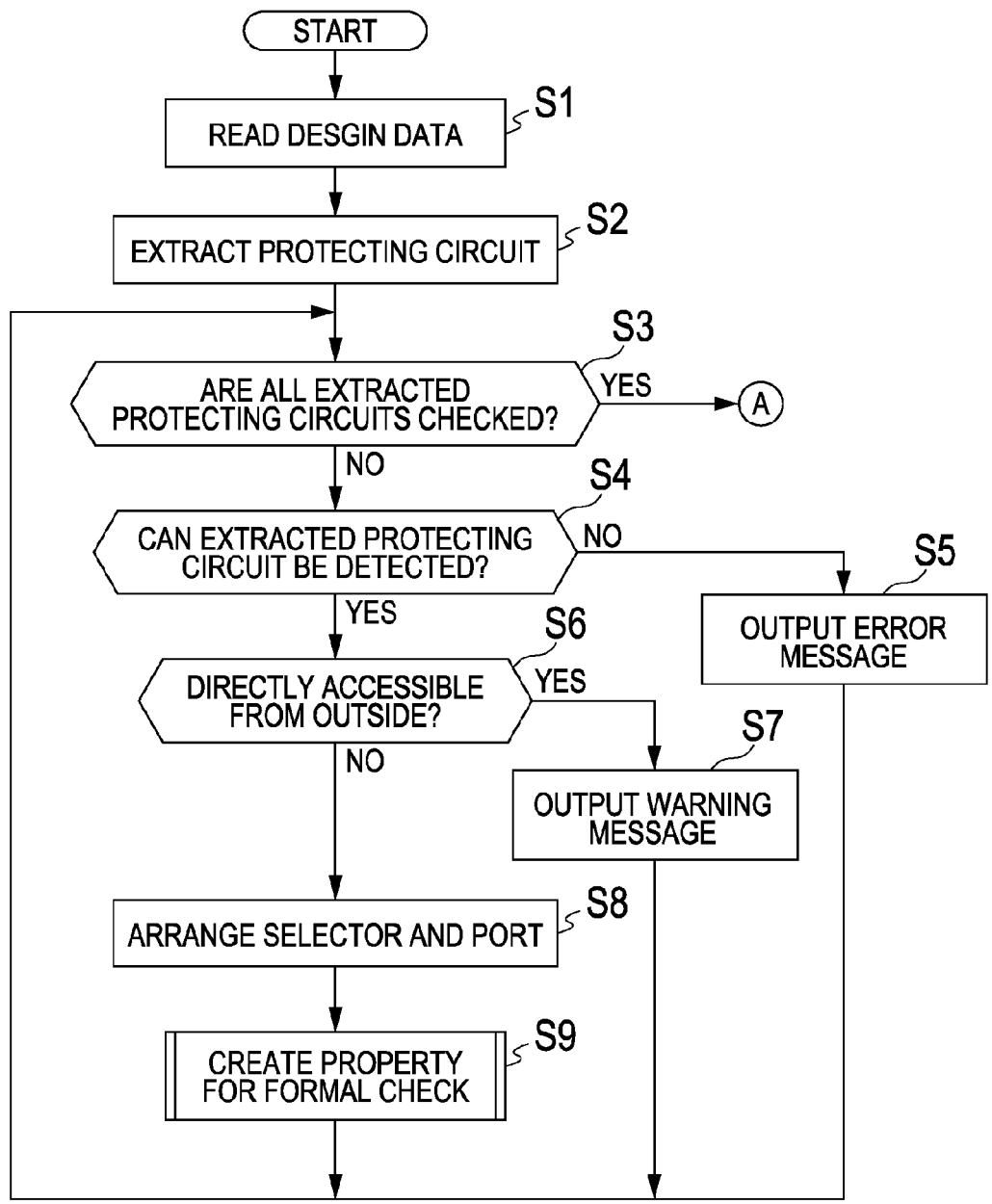
FIG. 4 is a flowchart showing an operation of the circuit design apparatus.
Figure 5:
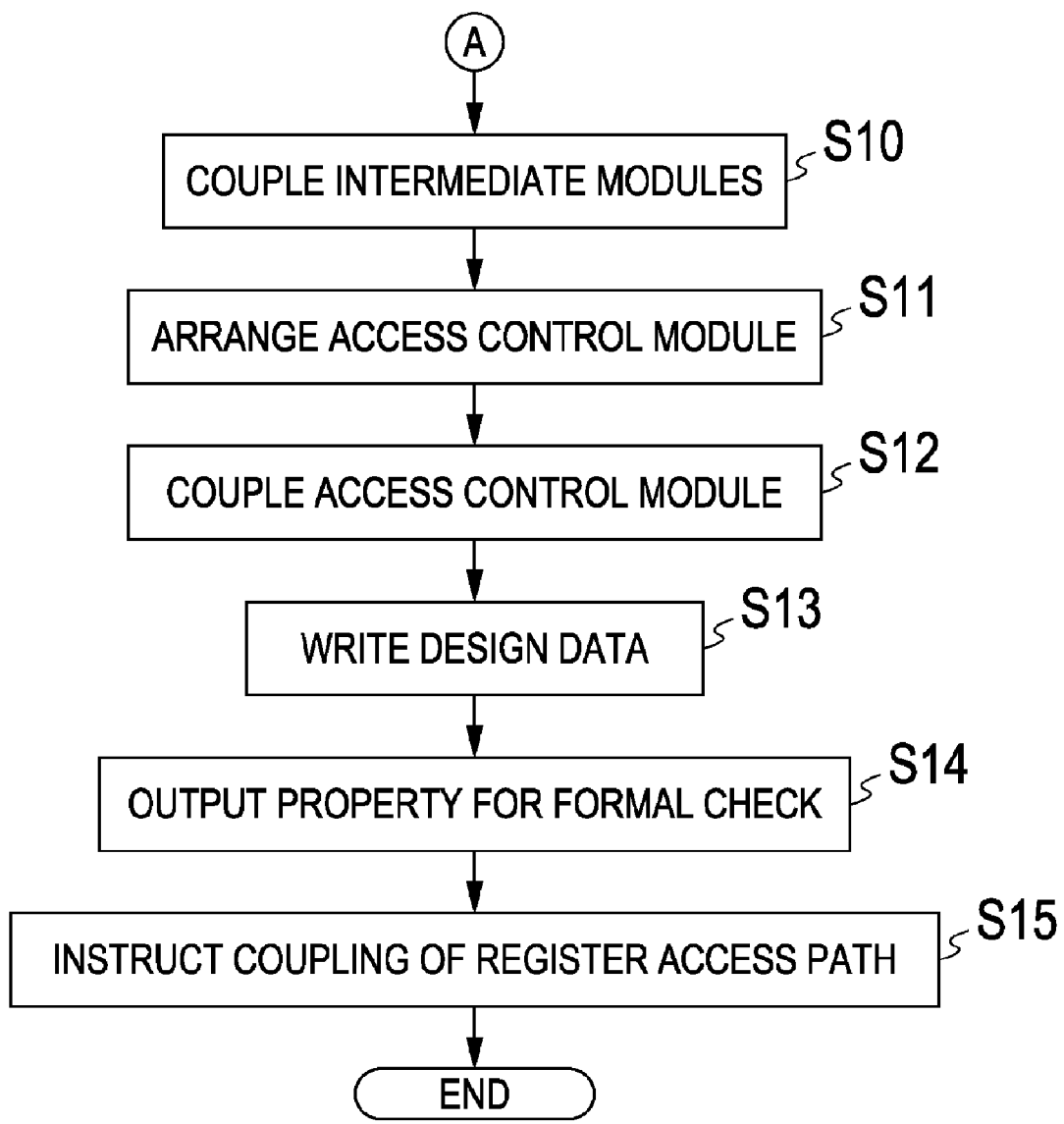
FIG. 5 is a flowchart showing the operation of the circuit design apparatus.

FIGS. 4 and 5 are flowcharts showing the operation of the circuit design apparatus.

First of all, the data reading unit 120 reads the design data from the input design data storing unit 110 (in step S1).

Subsequently, the protecting-circuit extracting unit 130 extracts the protecting circuit from the design data read by the data reading unit 120 (in step S2).

Subsequently, the error-check-circuit arranging unit 140 determines whether or not contents in the following steps S4 and S6 of all the protecting circuits extracted by the protecting-circuit extracting unit 130 are checked (in step S3).

When there is an unchecked protecting circuit (No in step S3), the error-check-circuit arranging unit 140 determines whether or not the extracted protecting circuit is actually detected (in step S4).

When the extracted protecting circuit is not detected (NO in step S4), the error-check-circuit arranging unit 140 outputs an error message to the monitor 104a (in step S5). Thereafter, the processing shifts to steps S3. Then, if there is a non-processed protecting circuit, the processing after steps S4 continues.

When the extracted protecting circuit is detected (Yes in step S4), the error-check-circuit arranging unit 140 determines whether or not the protecting circuit can be directly accessed from the outside (in step S6).

When the detected protecting circuit can be directly accessed from the outside (Yes in step S6), the error-check-circuit arranging unit 140 determines that the error check circuit does not need to be arranged and a warning message is outputted to the monitor 104a (in step S7). Thereafter, the processing shifts to step S3. If there is a non-processed protecting circuit, the processing after steps S4 continues.

When the detected protecting circuit cannot be directly accessed from the outside (No in step S6), the error-check-circuit arranging unit 140 arranges a selector corresponding to the protecting circuit. Further, the error-check-circuit arranging unit 140 arranges a port to connect the selector to an access control module, which will be described below (in step S8). Incidentally, the arrangement portion of this circuit will be described later. Furthermore, the error-check-circuit arranging unit 140 determines a name of signal, the signal being inputted to the arranged selector.

Subsequently, the property creating unit 160 for formal verification creates the property for formal verification for the individual protecting circuits to which the selector is arranged (in step S9). Incidentally, the processing will be described below.

Thereafter, the processing shifts to step S3. If there is a protecting circuit that has not been processed yet, the processing after step S4 continues.

When contents in steps S4 and S6 are checked for all the protecting circuits in step S3 (Yes in step S3), the following processing is performed.

When the module other than the uppermost layer has the protecting circuit to which the corresponding selector, the error-check-circuit arranging unit 140 connects the module to the port arranged in step S8 (in steps S10 in FIG. 5).

Subsequently, the error-check-circuit arranging unit 140 arranges an access control module (in step S11).

The access control module forcedly generates an error in response to an external request to the protecting circuit to which the selector is arranged in step S8.

Incidentally, the selector and the access control module form a main portion of the error check circuit.

Subsequently, the error-check-circuit arranging unit 140 connects the access control module to the port arranged in step S8 (in step S12).

Subsequently, the error-check-circuit arranging unit 140 writes the design data to which the error check circuit is arranged (in step S13).

Subsequently, the property creating unit 160 for formal verification outputs the property for formal verification created in step S9 (in step S14).

Subsequently, the error-check-circuit arranging unit 140 outputs an instruction to the monitor 104a, for the instruction being indicative of connecting the access control module to a register access path to the monitor 104a (in step S15). Thus, the connecting of the access control module and the register access path is promoted to a designer.

Herein, the description of the processing ends.

Hereinafter, a description will be given of contents of the processing with an example.

Figure 6:
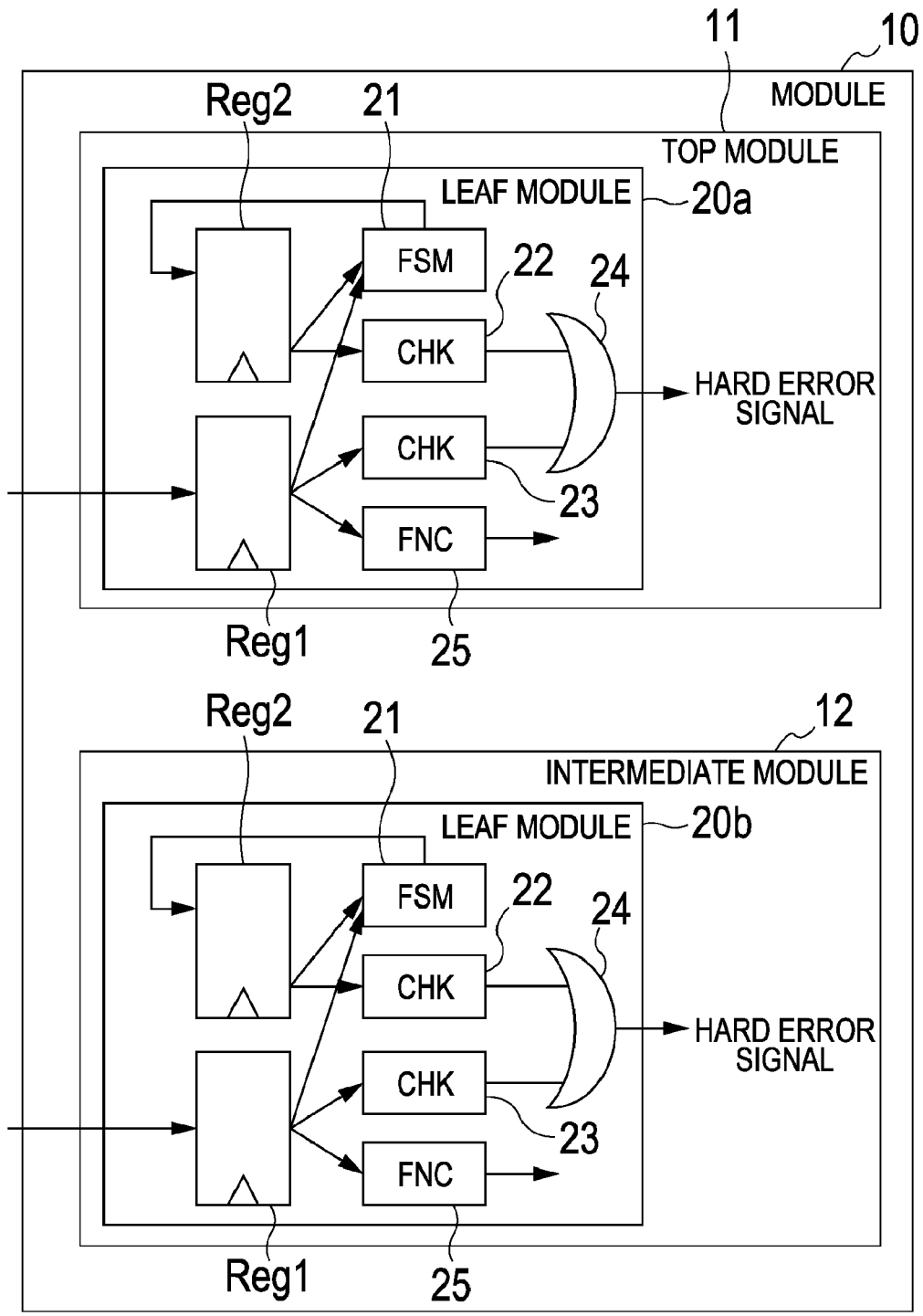
FIG. 6 is a diagram showing an example of a circuit before arranging an error check circuit.

FIG. 6 is a diagram showing an example of the circuit before arranging the error check circuit.

A module 10 has a plurality of layers, and specifically includes leaf modules 20a and 20b indicating the minimal circuit unit to the layers as needed.

Incidentally, according to the embodiment, the circuit structure of the leaf module 20a is similar to that of the leaf module 20b, and different reference numerals are used to leaf modules 20a and 20b for the purpose of easily understanding the description.

Referring to FIG. 6, the leaf module 20a is disposed just under a top module (uppermost module) 11. Further, the leaf module 20b is disposed in an intermediate module (under the top module) 12.

The leaf modules 20a and 20b individually have: registers (memory circuits) Reg1 and Reg2; finite state machines 21; error checkers 22 and 23; OR circuits 24; and function blocks 25.

The registers Reg1 and Reg2 are protected from the error with parity or ECC or other methods. Incidentally, the register Reg1 can be directly accessed from the outside of the leaf module 20a (20b).

The finite state machine 21 is disposed to the latter stage of the registers Reg1 and Reg2, and outputs a predetermined state that changes in accordance with an outputs of the registers Reg1 and Reg2 to the register Reg2.

The error checker 22 checks whether or not there is an error outputted from the register Reg1. Further, the error checker 23 checks whether or not there is an error outputted from the register Reg2.

The error checkers 22 and 23 detect errors and then output an "H" logic, respectively.

The error checker of one or both the error checkers 22 and 23 detects the error and then the OR circuit 24 outputs the error as a hard error signal to outside of the leaf module 20a (20b).

The function block 25 performs predetermined signal processing in accordance with the output of the register Reg1.

For the purpose of easy understanding, FIG. 6 shows only the leaf module with the protecting circuit. Another leaf module without the protecting circuit may be arranged in the top module 11 and the intermediate module 12.

Figure 7:
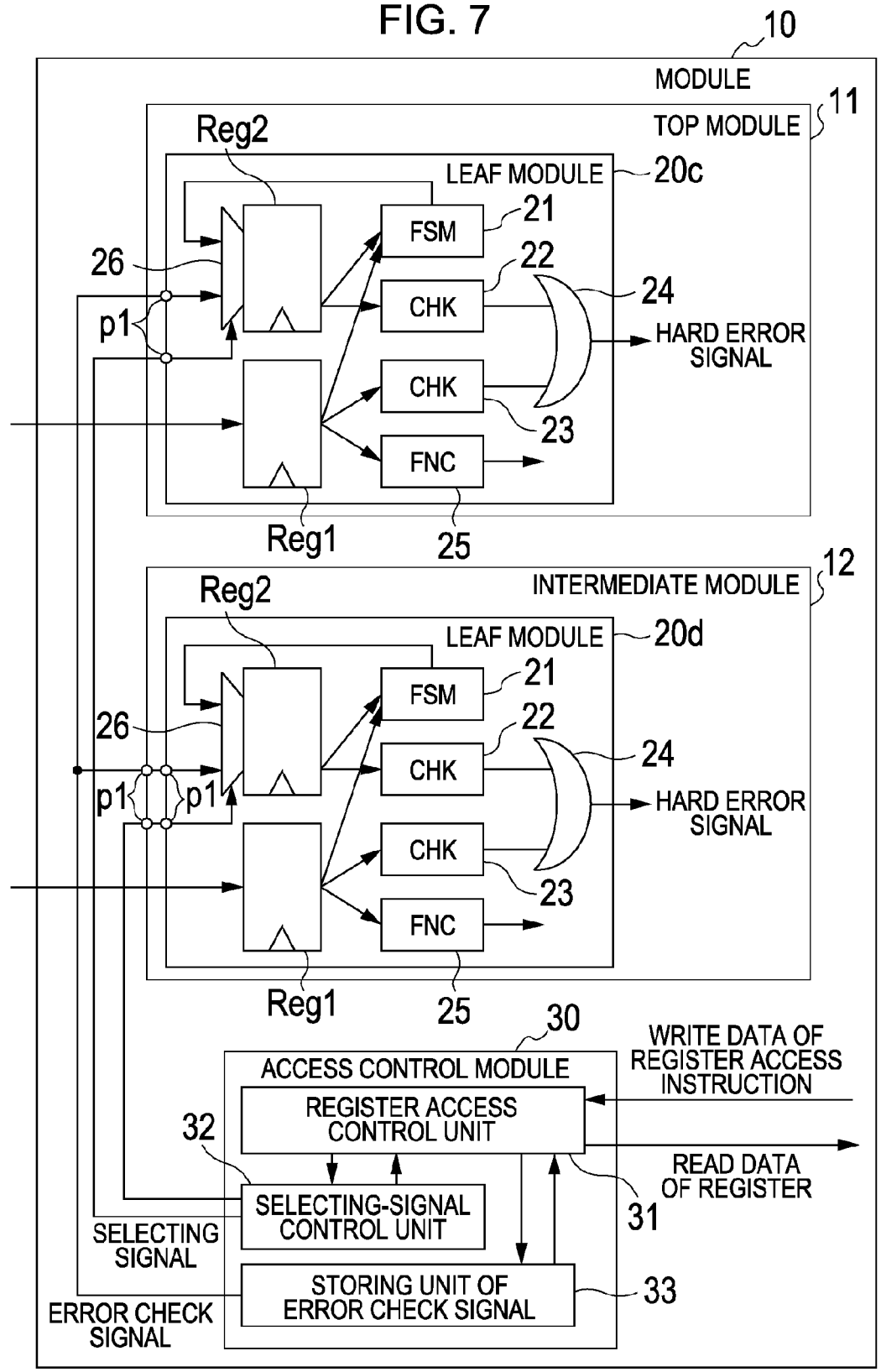
FIG. 7 is a diagram showing an example of a circuit after arranging the error check circuit.

FIG. 7 is a diagram showing an example of the circuit after arranging the error check circuit.

A leaf module 20c corresponds to the leaf module 20a, and a leaf module 20d corresponds to the leaf module 20b.

Incidentally, the circuit structure of the leaf module 20c is similar to that of the leaf module 20d, and different reference numerals are used to the leaf modules 20c and 20d for the purpose of easily understanding the description.

Unlike the leaf modules 20a and 20b, the leaf modules 20c and 20d individually have selectors 26 for inserting an error at the front stage of the register Reg2.

Incidentally, since the register Reg1 can be directly accessed from the outside as mentioned in step S6 in FIG. 4, the selector is not arranged at the front stage.

In the leaf modules 20c and 20d, the selector 26 is connected to the access control module 30, which will be described later, via a port p1.

The selector 26 selects whether a signal to be outputted by the finite state machine 21 or an error check signal to be outputted by the access control module 30 is received, in accordance with the selecting signal outputted by the access control module 30.

Further, as described in step S10 in FIG. 5, the access control module 30 is arranged just under the top module 11. The arrangement just under the top module 11 facilitates the wiring to the selector 26 in the leaf modules 20c and 20d, respectively. Alternatively, the access control module 30 can be arranged under the intermediate module.

The access control module 30 has: a register access control unit 31; a selecting-signal control unit 32; and an error-check-signal storing unit 33.

The register access control unit 31 supports a plurality of the register access protocols.

As described in step S15 in FIG. 5, the register access control unit 31 is connected to the register access path by the designer in accordance with an instruction outputted to the monitor.

Further, the register access control unit 31 receives write data (request for outputting the check signal) of a register access instruction for error check, write data being inputted via a register access path. Furthermore, the register access control unit 31 outputs an instruction to the selecting-signal control unit 32 and the error-check-signal storing unit 33 in accordance with contents of the received data, the instruction being used for generating the error to the leaf module 20c or the leaf module 20d.

Further, the register access control unit 31 outputs, as register read data, the data stored in the selecting-signal control unit 32 or the data stored in the error-check-signal storing unit 33.

The selecting-signal control unit 32 outputs the selecting signal that is used for determining the selector 26 as the output destination of the error check signal, in accordance with the register access control unit 31.

The error-check-signal storing unit 33 stores an error check signal to be transmitted to the leaf modules 20c and 20d.

The error-check-signal storing unit 33 outputs an error check signal in accordance with an instruction from the register access control unit 31. More specifically, the error check signal is outputted to the leaf module as the output destination of the selecting signal outputted by the selecting-signal control unit 32 in accordance with the instruction from the register access control unit 31.

Figure 8:
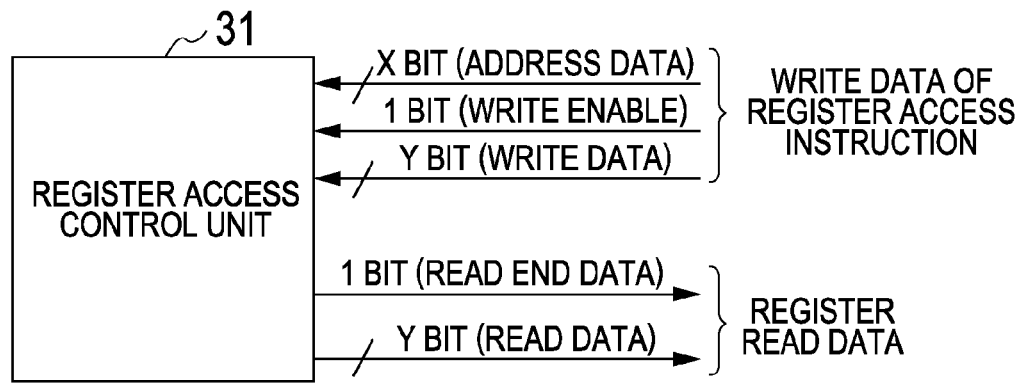
FIG. 8 is a diagram showing an example of a protocol supported by a register access control unit.

FIG. 8 is a diagram showing an example of a protocol that is supported by the register access control unit.

The register access control unit 31 receives an address data signal having X bits (where X is a natural number) included in the write data of the register access instruction, a write enable signal having one bit, and write data having Y bits (where Y is a natural number). Incidentally, values of X and Y are designated by the designer.

Upon receiving the write enable signal, the register access control unit 31 writes the write data having Y bits to an address designated by the address data signal having X bits.

Further, the register access control unit 31 outputs, as the register read data, read end data having one bit and read data having Y bits.

The register access control unit 31 outputs read end data and simultaneously (or after outputting the data) outputs the read data having Y bits.

Figure 9:
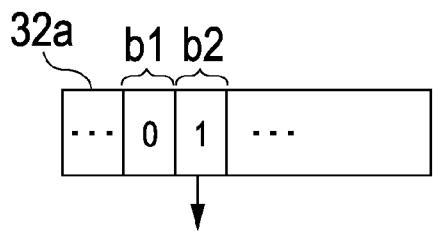
FIG. 9 is a diagram showing the structure of a selecting-signal control unit.

FIG. 9 is a diagram showing the structure of the selecting-signal control unit.

The selecting-signal control unit 32 has one or a plurality of (one in FIG. 9) registers 32a. The designer designates the register address of the selecting-signal control unit 32.

Bits of the register 32a have a one-to-one corresponding relationship with the registers Reg2, respectively. The selecting-signal control unit 32 outputs the selecting signal to the selector 26 having the register Reg2 corresponding to the bit having a value "1".

Referring to FIG. 9, as an example, a bit b1 corresponds to the register Reg2 in the leaf module 20c, and a bit b2 corresponds to the register Reg2 in the leaf module 20d.

Incidentally, the error-check-circuit arranging unit 140 determines the number of the registers 32a on the basis of the number of the registers Reg2 and the maximal bit width of the register designated by the designer.

Alternatively, the selector 26 that outputs the selecting signal may be specified by decoding information on the bits of the register 32a.

Figure 10:
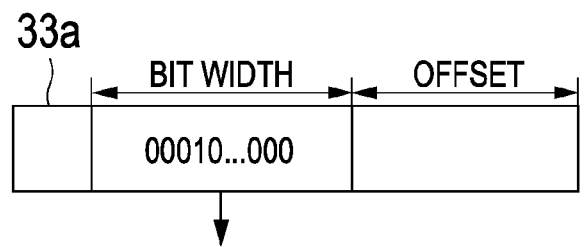
FIG. 10 is a diagram showing the structure of the error-check-signal storing unit.

FIG. 10 is a diagram showing the structure of an error-check-signal storing unit.

The error-check-signal storing unit 33 has a register 33a that stores the error check signal. The bit width and the register address of the register 33a are designated by the designer.

Incidentally, when the bit width is smaller than the maximal bit width of the register designated by the designer, the position of the bit to be arranged may be arranged by offset designation.

Next, a specific method for creating the property for formal verification in steps S13 will be given.

Figure 11:
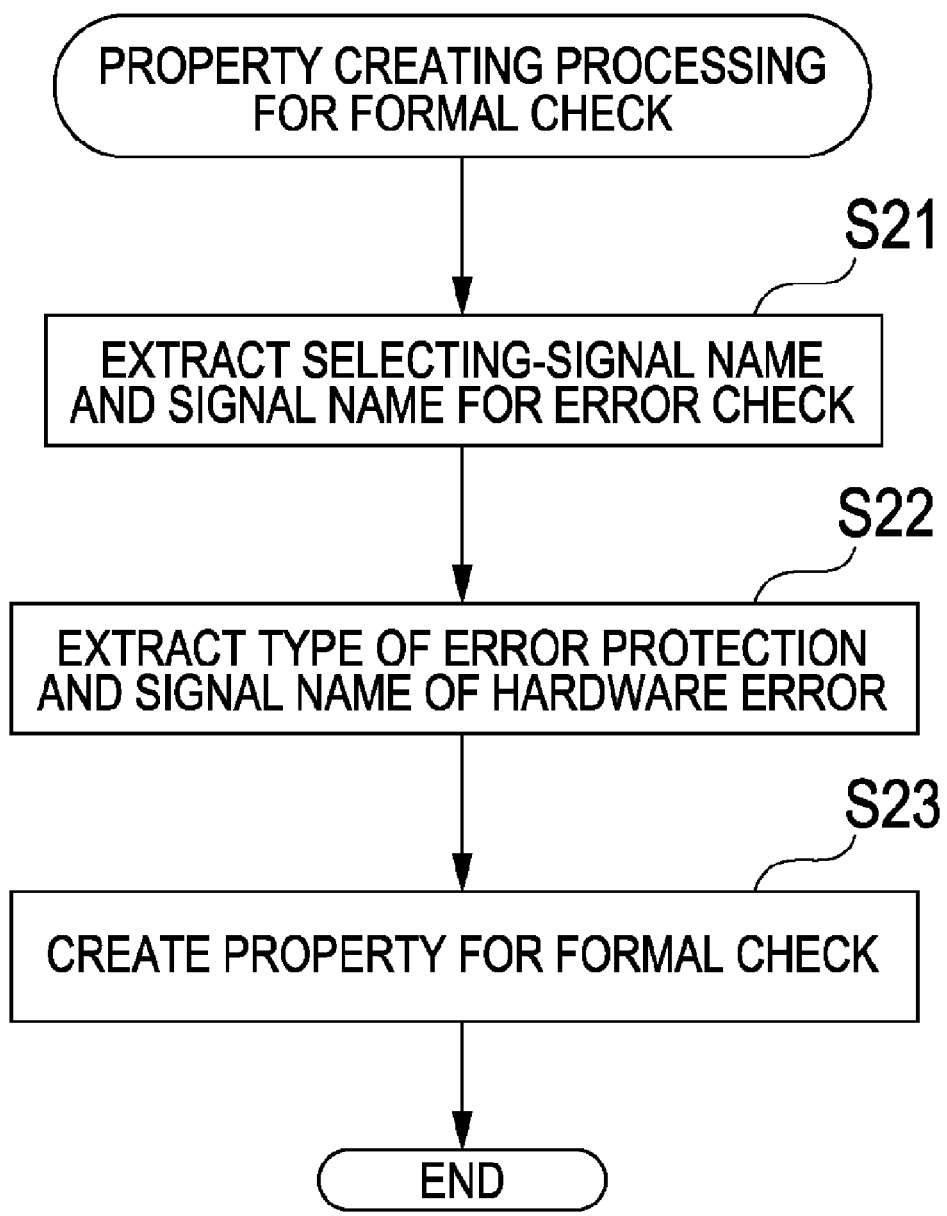
FIG. 11 is a flowchart showing processing for creating a property for formal verification.

FIG. 11 is a flowchart showing processing for creating the property for formal verification.

First of all, the property creating unit 160 for formal verification extracts a selecting-signal name and the error check signal name (in step S21).

Subsequently, the property creating unit 160 for formal verification extracts the type of the error protection (e.g., parity or ECC) of the protecting circuit and the hard-error signal name (in step S22). When the type of the error protection is, e.g., parity, the property creating unit 160 extracts the hard-error signal name by using a naming rule. Further, when the type of the error protection is, e.g., ECC, the property creating unit 160 extracts the hard-error signal name on the basis of the above-mentioned list.

Subsequently, the property creating unit 160 for formal verification creates the property for formal verification on the basis of the information obtained in steps S21 and S22 (in step S23).

Herein, the description of the processing ends.

FIG. 12 is a diagram showing an example of the property for formal verification created by processing for creating the property for formal verification.

The property for formal verification 161 corresponds to a PSL (Property Specification Language) indicating that "A hard-error name (HE) is necessarily generated at the next cycle when the error check signal is inputted in a state in which the selecting-signal name (EC) selects the reception of the error check signal name (ED)".

Incidentally, the created property is not limited to this. For instance, a property such as "Don't detect a hard error when the error is not inputted" can be created.

As mentioned above, with the circuit design apparatus 100 according to the embodiment, the error check circuit can be properly and easily arranged without fails. Thus, the troublesomeness of the designer can be removed and the miss of arrangement can be prevented.

Further, the selectors 26 are controlled by one access control module 30, thereby preventing the increase in circuit scale.

Furthermore, the logical check can be supported by automatically creating the property for formal verification of the error detecting circuit.

According to the present invention, the description is given of the circuit design apparatus and the circuit design method with reference to the drawings according to the embodiment. However, the present invention is not limited to this and the structures of the units can be replaced with an arbitrary structure having the same function. Further, another arbitrary structure or step can be added to the present invention.

Furthermore, the present invention may be obtained by combining two or more arbitrary structures (features).

Incidentally, the aforementioned processing function can be realized by a computer. In this case, such a program is provided that processing contents of a function provided for the circuit design apparatus 100 are described. The program is executed by a computer, thereby realizing the processing function on the computer. The program in which the processing contents are described can be recorded to a computer-readable recording medium. As the computer-readable recording medium, there are a magnetic recording device, an optical disk, a magneto-optical recording medium, and a semiconductor memory. As the magnetic recording device, there are a hard disk device (HDD), a flexible disk (FD), and a magnetic tape. As the optical disk, there are a DVD (Digital Versatile Disc), a DVD-RAM (Random Access Memory), a CD-ROM (Compact Disc Read Only Memory), and a CD-R (Recordable)/RW (Rewritable). As the magneto-optical recording medium, there is an MO (Magneto-optical disk).

Upon distributing the program, a movable recording medium for recording the program, such as a DVD and a CD-ROM is sold. Further, the program can be stored to a storage device of a server computer, and the program can be transferred to another computer from the server computer via a network.

The computer that executes a circuit design program stores a program recorded to the movable recording medium or the program transferred from the server computer to a storage device thereof. Further, the computer reads the program from the storage device thereof and executes processing under the program. Alternatively, the computer directly can read the program from the movable recording medium, and can execute processing under the program. Alternatively, the computer can sequentially execute processing under the received program every time transferring the program from the server computer.

All examples and conditional language recited herein are intended for pedagogical purposes to aid the reader in understanding the invention and the concepts contributed by the inventor to furthering the art, and are to be construed as being without limitation to such specifically recited examples and condition, nor does the organization of such examples in the specification relate to a showing of superiority and inferiority of the invention. Although the embodiment of the present inventions have been described in detail, it should be understood that the various changes, substitutions, and alternations could be made hereto without departing from the spirit and scope of the invention.

What is claimed is:

1. A circuit design apparatus for generating design information of a circuit device, the apparatus comprising:
   an extracting unit that extracts information of a memory circuit with an error protection circuit from design information of a LSI, the error protection circuit being for performing an error protection over data stored in the memory circuit;
   a circuit arrangement controller that arranges design information of a check circuit into the design information of the LSI to generate the design information of the circuit device including the LSI and the check circuit, the check circuit including a storage circuit for storing a check signal and a controller circuit for controlling the storage circuit to output the check signal to the memory circuit extracted by the extracting unit in response to an external request, the check signal being input into the check circuit to generate an error in the memory for verifying the error protection by the error protection circuit;
   wherein the check circuit selectively supplies the check signal to the memory circuit with the error protection circuit, when the extracting unit extracts a plurality of the memory circuits,
   wherein the check circuit comprises:
   an access control unit that outputs a request;
   a selector that selects the memory circuit to which the check signal is to be supplied in accordance with the request from the access control unit; and
   a check signal output unit that stores the check signal and outputs the check signal to the memory circuit selected by the selector.

2. The circuit design apparatus according to claim 1, wherein the check circuit excludes the memory circuit which is to be directly accessed from the outside of the circuit design apparatus, from a target of supplying the check signal.

3. The circuit design apparatus according to claim 1, further comprising:
   a property creating unit that creates a property for formal verification of the memory circuit to which the check signal is supplied by the check circuit.

4. The circuit design apparatus according to claim 3, wherein the property creating unit extracts the check signal and a selecting signal that is outputted when the selecting unit selects the signal supply circuit; and further extracts the type of a function for checking the output error provided for the memory circuit and a signal outputted by the memory circuit upon generating the error to create the property.

5. A circuit design method for generating design information of a circuit device, the method comprising:
   extracting information of a memory circuit with an error protection circuit from design information of a LSI, by using a computer, the error protection circuit being for performing an error protection over data stored in the memory circuit;
   arranging design information of a check circuit into the design information of the LSI to generate the design information of the circuit device including the LSI and the check circuit, by using a computer, the check circuit including a storage circuit for storing a check signal and a controller circuit for controlling the storage circuit to output the check signal to the memory circuit extracted in the extracting information, the check signal being input into the check circuit to generate an error in the memory for verifying the error protection by the error protection circuit
   wherein the check circuit selectively supplies the check signal to the memory circuit with the error protection circuit, when the extracting unit extracts a plurality of the memory circuits;
   wherein the check circuit comprises:
   an access control unit that outputs a request;
   a selector that selects the memory circuit to which the check signal is to be supplied in accordance with the request from the access control unit; and
   a check signal output unit that stores the check signal and outputs the check signal to the memory circuit selected by the selector.

\* \* \* \* \*